United States Patent
Moon et al.

(10) Patent No.: US 11,871,541 B2
(45) Date of Patent: Jan. 9, 2024

(54) ELECTRONIC DEVICE INCLUDING VAPOR CHAMBER

(71) Applicant: SAMSUNG ELECTRONICS CO., LTD., Suwon-si (KR)

(72) Inventors: Hongki Moon, Suwon-si (KR); Kyungha Koo, Suwon-si (KR); Yoonsun Park, Suwon-si (KR); Youngjae You, Suwon-si (KR); Hyunjoo Lee, Suwon-si (KR); Joseph Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/673,099

(22) Filed: Feb. 16, 2022

(65) Prior Publication Data
US 2022/0272868 A1 Aug. 25, 2022

Related U.S. Application Data

(63) Continuation of application No. PCT/KR2022/001507, filed on Jan. 27, 2022.

(30) Foreign Application Priority Data

Feb. 22, 2021 (KR) .................. 10-2021-0023220

(51) Int. Cl.
*H05K 7/20* (2006.01)
(52) U.S. Cl.
CPC ....... *H05K 7/20327* (2013.01); *H05K 7/2099* (2013.01); *H05K 7/20336* (2013.01); *H05K 7/20963* (2013.01)
(58) Field of Classification Search
CPC ........... H05K 7/20327; H05K 7/20336; H05K 7/2099; H05K 7/20963
See application file for complete search history.

(56) References Cited

U.S. PATENT DOCUMENTS

| 2015/0083371 A1 | 3/2015 | Hsieh et al. |
| 2018/0143671 A1 | 5/2018 | Lee et al. |

(Continued)

FOREIGN PATENT DOCUMENTS

| JP | 2019-082264 A2 | 5/2019 | |
| JP | WO 2021090840 | * 5/2021 | ........... H01L 23/427 |

(Continued)

OTHER PUBLICATIONS

WO 2021090840 English translation (Year: 2021).*

(Continued)

*Primary Examiner* — Mukundbhai G Patel
(74) *Attorney, Agent, or Firm* — Nixon & Vanderhye P.C.

(57) ABSTRACT

An electronic device may include: a housing, a support member disposed in an internal space of the housing and including a first surface and a second surface facing a direction opposite the first surface, wherein the support member includes a through hole in at least a portion thereof, and a vapor chamber disposed through at least a portion of the through-hole, wherein the vapor chamber may include: a first plate including a first plate portion including a plurality of pillars and a first flange portion extending along an edge of the first plate portion to have a first width, a second plate having a size corresponding to the first plate portion and including a second plate portion including a recess and a second flange portion extending along an edge of the second plate portion to have a second width less than the first width, and at least one wick disposed in the recess, wherein the wick may be accommodated through a closed space defined through coupling of the first plate and the second plate.

20 Claims, 18 Drawing Sheets

(56) References Cited

U.S. PATENT DOCUMENTS

2020/0045847 A1    2/2020  Wakaoka et al.
2020/0205316 A1    6/2020  Weng
2020/0323103 A1*  10/2020  Lee .................... F28D 15/046
2020/0337183 A1   10/2020  Lee et al.
2021/0041926 A1*   2/2021  Park .................... H05K 9/0081

FOREIGN PATENT DOCUMENTS

| KR | 10-2015-0027005 | 3/2015 |
| KR | 10-1508877 | 4/2015 |
| KR | 10-2018-0057828 | 5/2018 |
| KR | 10-2077002 B1 | 2/2020 |
| KR | 10-2020-0056917 A | 5/2020 |
| KR | 10-2020-0123377 A | 10/2020 |

OTHER PUBLICATIONS

Search Report dated May 13, 2022 in International Patent Application No. PCTKR2022001507.
Written Opinion dated May 13, 2022 in International Patent Application No. PCTKR2022001507.

* cited by examiner

ELECTRONIC DEVICE INCLUDING VAPOR CHAMBER

CROSS-REFERENCE TO RELATED APPLICATIONS

This application is a continuation of International Application No. PCT/KR2022/001507 designating the United States, filed on Jan. 27, 2022, in the Korean Intellectual Property Receiving Office and claiming priority to Korean Patent Application No. 10-2021-0023220, filed on Feb. 22, 2021, in the Korean Intellectual Property Office, the disclosures of which are incorporated by reference herein in their entireties.

BACKGROUND

Field

The disclosure relates to an electronic device including a vapor chamber.

Description of Related Art

While electronic devices are gradually becoming smaller, functions thereof are gradually being diversified. According to the miniaturization and slimming of electronic devices, electrical elements embedded in an electronic device may be arranged such that the distances of the electronic elements from a surrounding structure are reduced or the electronic elements are concentrated, and may generate high-temperature heat due to the implementation of various functions. Such high-temperature heat may cause malfunction of the electronic device and may cause discomfort to a user. Accordingly, the electronic device may need a heat dissipation structure capable of effectively dissipating heat generated from the electrical elements to the surroundings.

An electronic device may include at least one board (e.g., a printed circuit board (PCB)) disposed in the internal space thereof and at least one electrical element (e.g., an application processor (AP)) as a heat generation source disposed on the board. At least one electrical element may generate heat, and the generated heat may be diffused to the surroundings through a heat dissipation structure disposed in the internal space of the electronic device. Such a heat dissipation structure may include a vapor chamber disposed to be adjacent to or at least partially in contact with the electrical element in the internal space of the electronic device. In the vapor chamber, two metal plates are bonded to each other to define a closed space, and a wick structure containing a working fluid (e.g., water) may be accommodated in the closed space, and the working fluid may lower high-temperature heat generated in the surroundings or diffuse the high-temperature heat to the surroundings via a pillar structure in the closed space while being repeatedly vaporized and liquefied.

However, since the vapor chamber is configured to have a relatively large volume through a bonding structure of the two plates, the vapor chamber may act counter to the slimming of the electronic device. For example, the vapor chamber may be disposed to at least partially penetrate a through hole provided in an inner bracket (e.g., a support member), but the bonding thickness of the two metal plates may act counter to the slimming of the electronic device. When such a bonding thickness is accommodated inside the through hole, the space in which the inner bracket is omitted is increased, and thus the rigidity of the electronic device may be reduced. In addition, since pillars are formed on the metal plate through a chemical process (e.g., an etching process), corrosion, perforation, or cracking may occur in the metal plate having a predetermined thickness or less. Therefore, the vacuum degree of the closed space may be lowered, and the performance of the vapor chamber may be degraded.

SUMMARY

Embodiments of the disclosure provide an electronic device including a vapor chamber.

Embodiments of the disclosure provide an electronic device including a vapor chamber that is capable of contributing to reduction in rigidity and slimming of the electronic device.

Embodiments of the disclosure provide an electronic device including a vapor chamber that is capable of increasing a yield and reducing a manufacturing cost.

An electronic device according to various example embodiments may include: a housing, a support member disposed in an internal space of the housing and including a first surface and a second surface facing a direction opposite the first surface, wherein the support member may include a through hole in at least a portion thereof, and a vapor chamber disposed through at least a portion of the throughhole, wherein the vapor chamber may include: a first plate including a first plate portion including a plurality of pillars and a first flange portion extending along an edge of the first plate portion and having a first width, a second plate having a size corresponding to the first plate portion and including a second plate portion including a recess and a second flange portion extending along an edge of the second plate portion and having a second width less than the first width, and at least one wick disposed in the recess, wherein the wick may be accommodated through a closed space defined through coupling of the first plate and the second plate, wherein the first plate and the second plate may be coupled to each other through bonding of the first flange portion and the second flange portion, and wherein the vapor chamber may be disposed in a manner in which at least a portion of the first flange portion that does not overlap the second flange portion is disposed on the first surface when the first plate is viewed from above.

The electronic device according to various example embodiments of the disclosure includes a vapor chamber having an improved bonding structure, and the vapor chamber is disposed on a support member via a bonding structure. Therefore, it is possible to suppress a decrease in rigidity of the electronic device and to be helpful in sliming the electronic device. In addition, the plates in the vapor chamber are provided through a mechanical process (e.g., a stamping process, a pressing process, or a beading process) so that the plates can be helpful in reinforcing mechanical strength.

BRIEF DESCRIPTION OF THE DRAWINGS

In connection with the description of the drawings, the same or similar components may be denoted by the same or similar reference numerals. Additionally, the above and other aspects, features and advantages of certain embodiments of the present disclosure will be more apparent from the following detailed description, taken in conjunction with the accompanying drawings, in which.

Figure 5A:
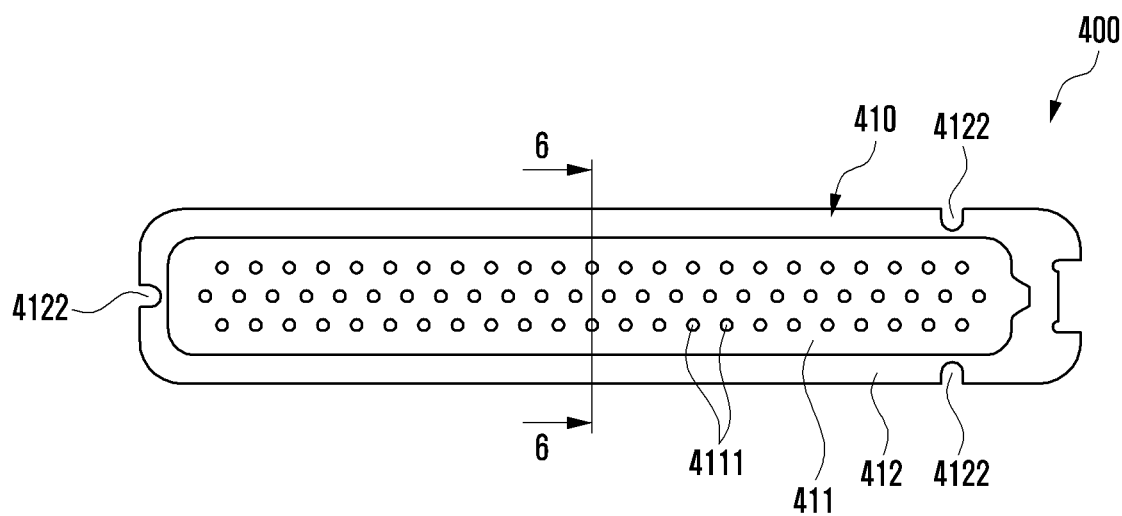
Figure 5B:
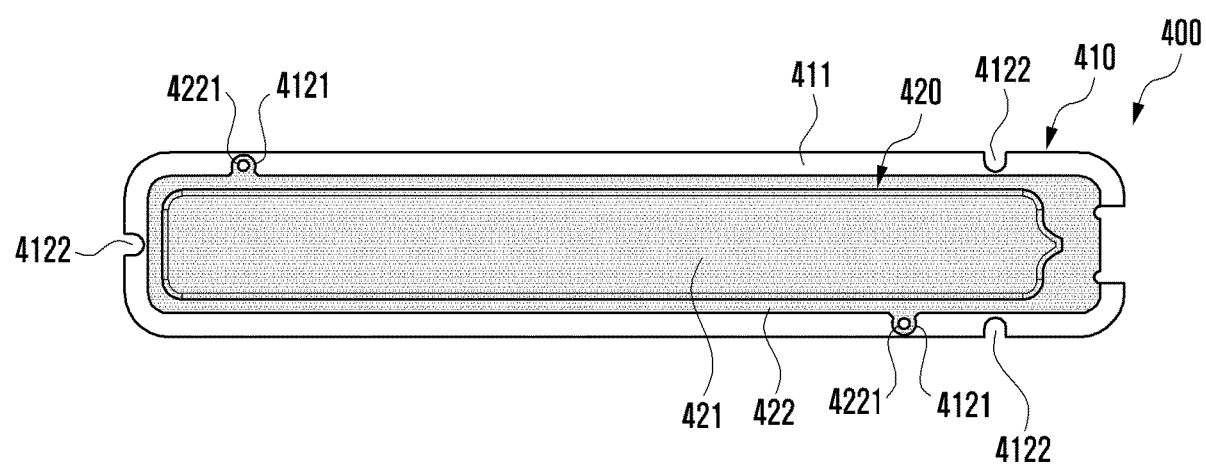
Figure 6:
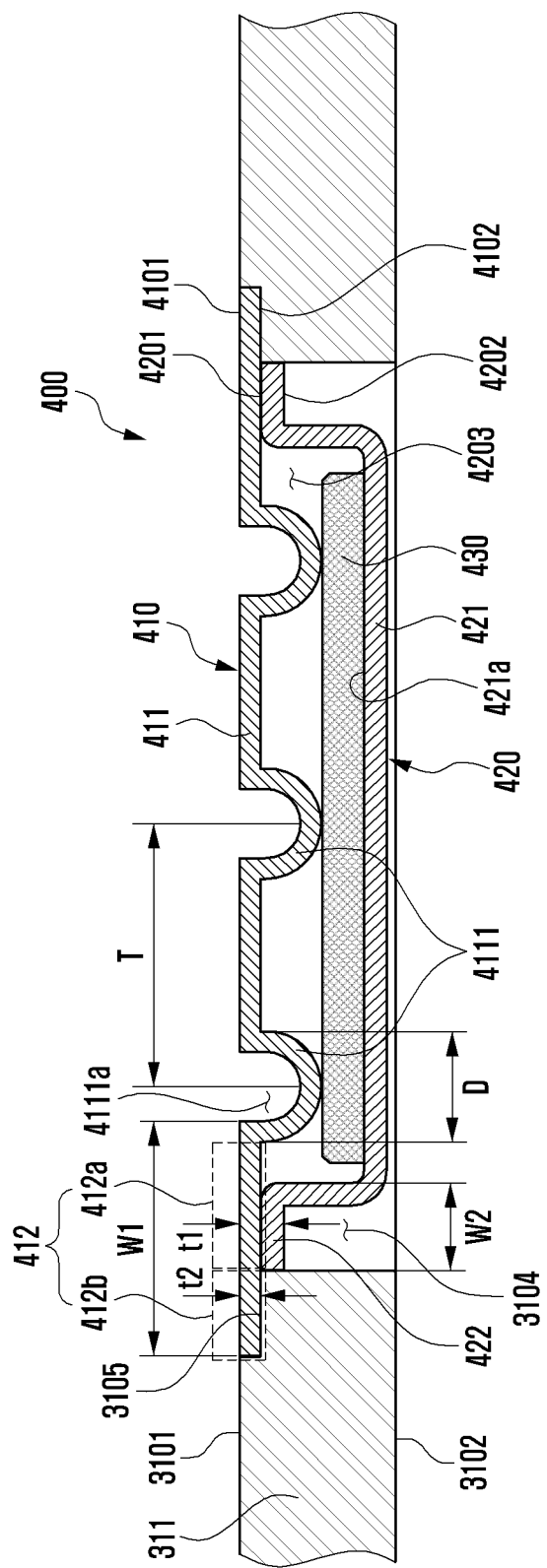
Figure 7A:
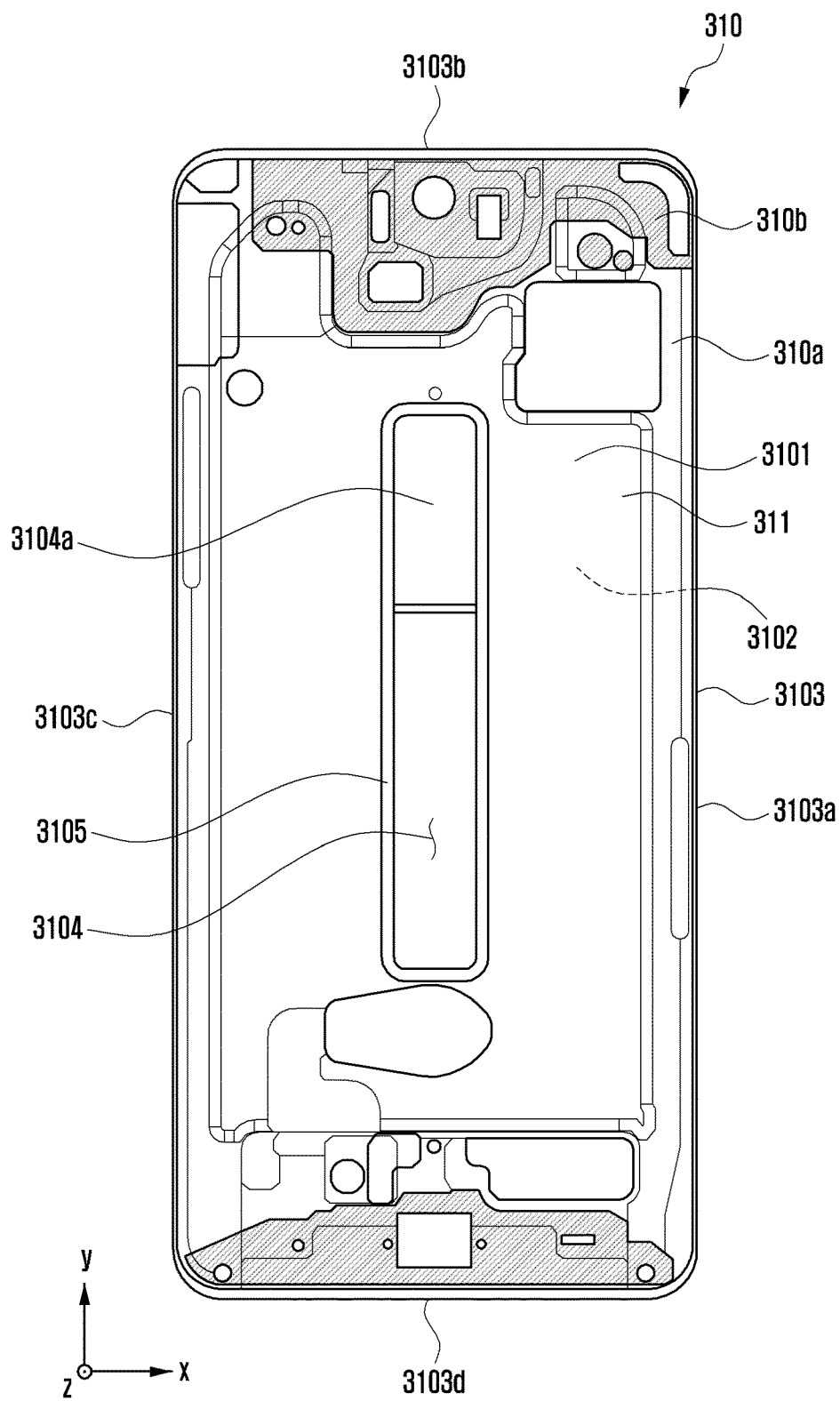
Figure 7B:
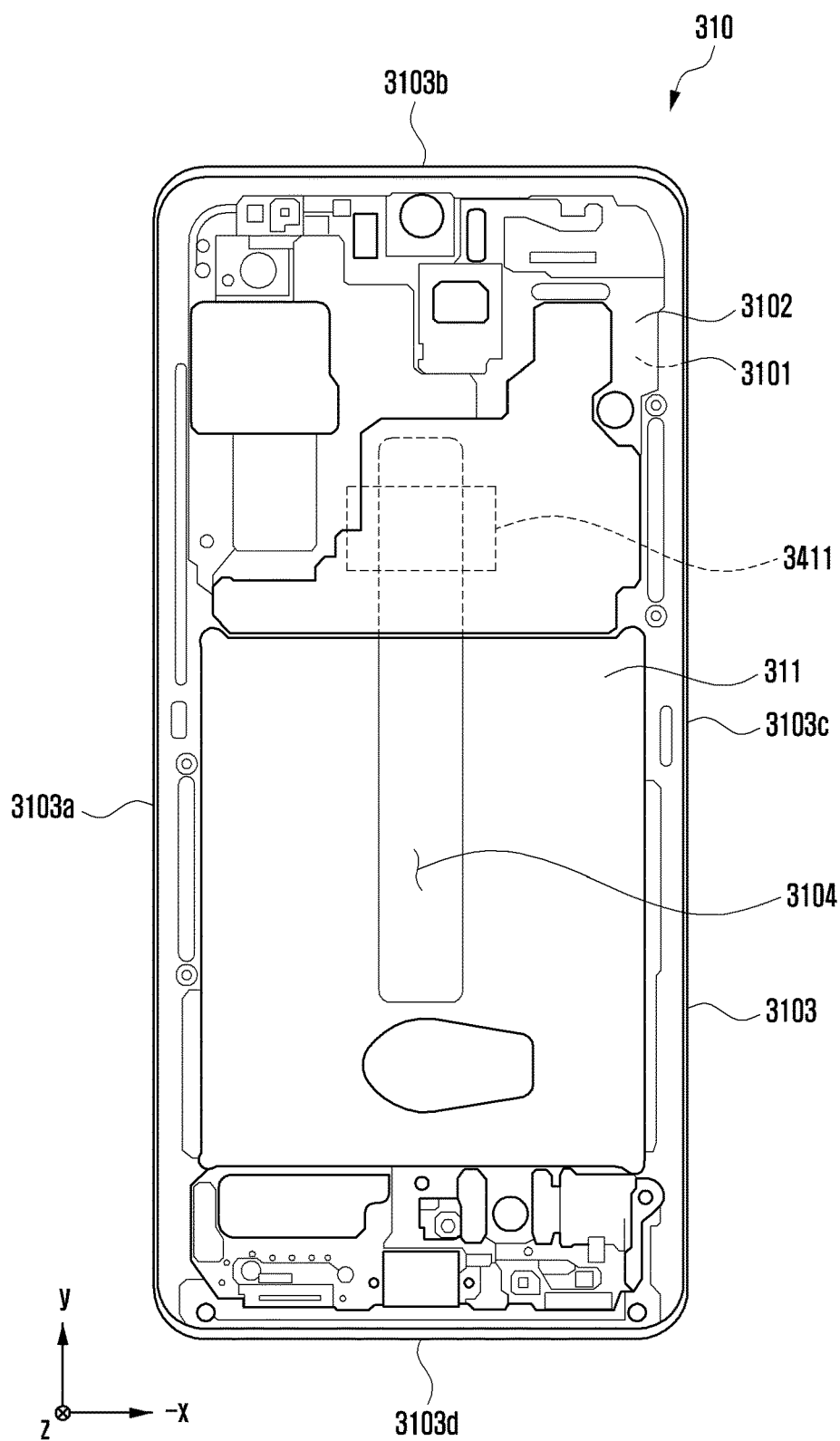
Figure 8A:
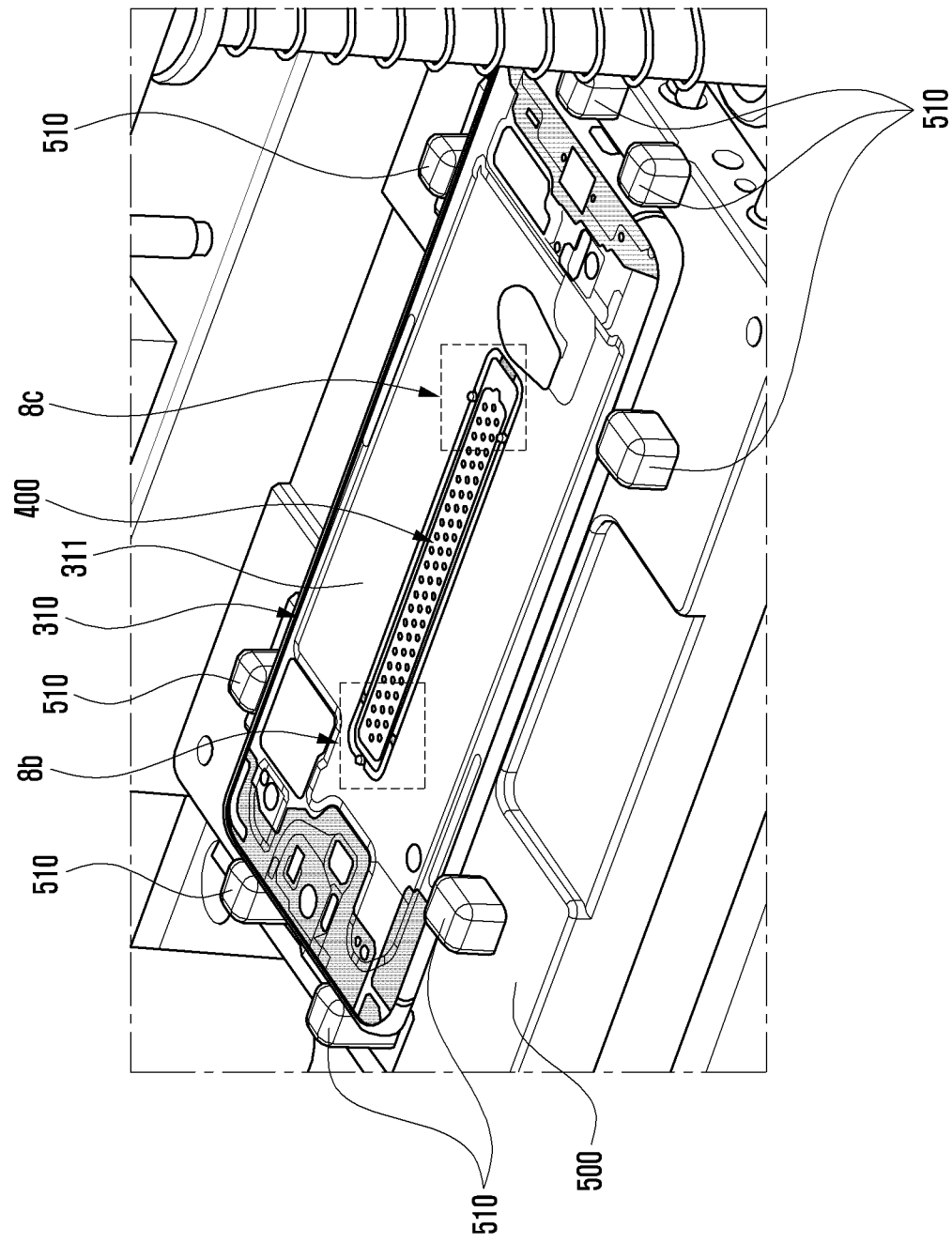
Figure 8B:
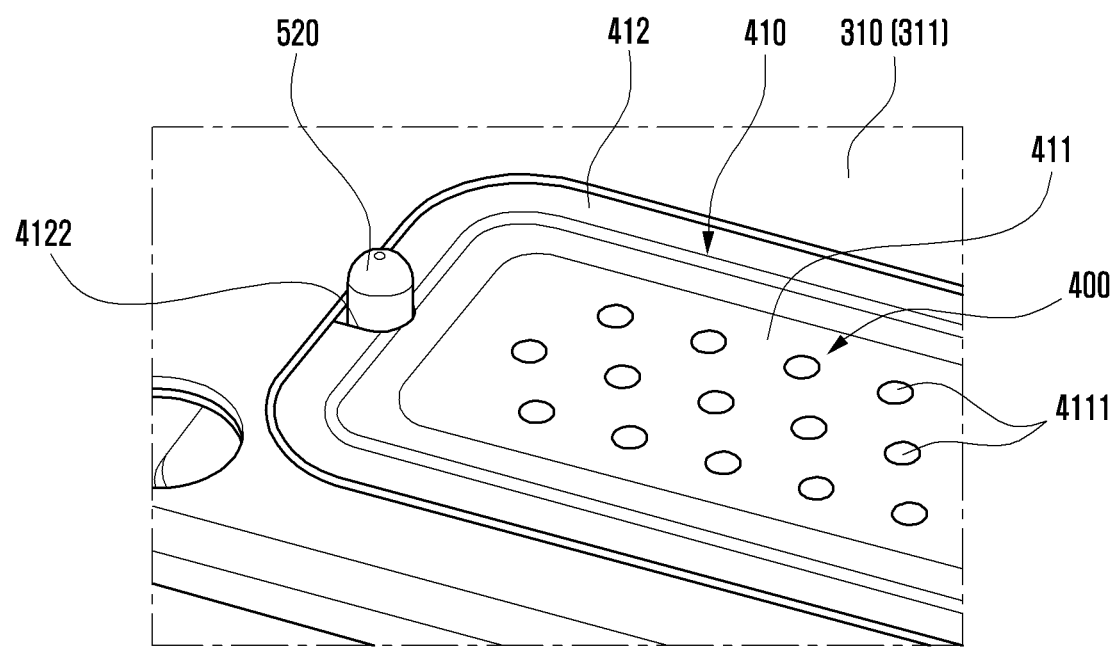
Figure 8C:
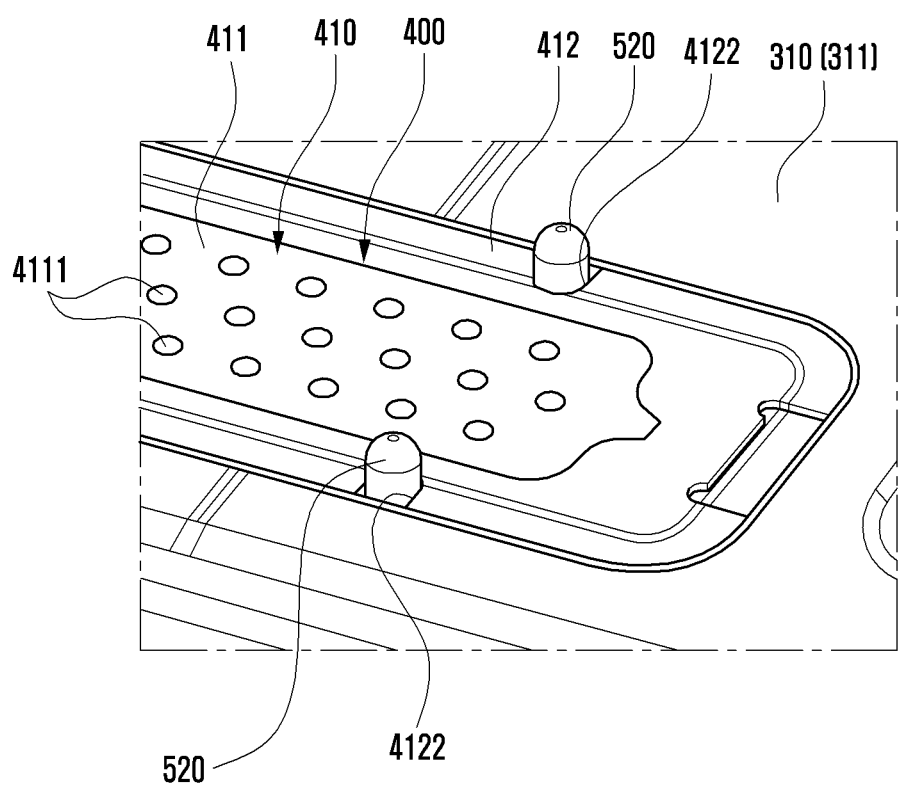
Figure 9:
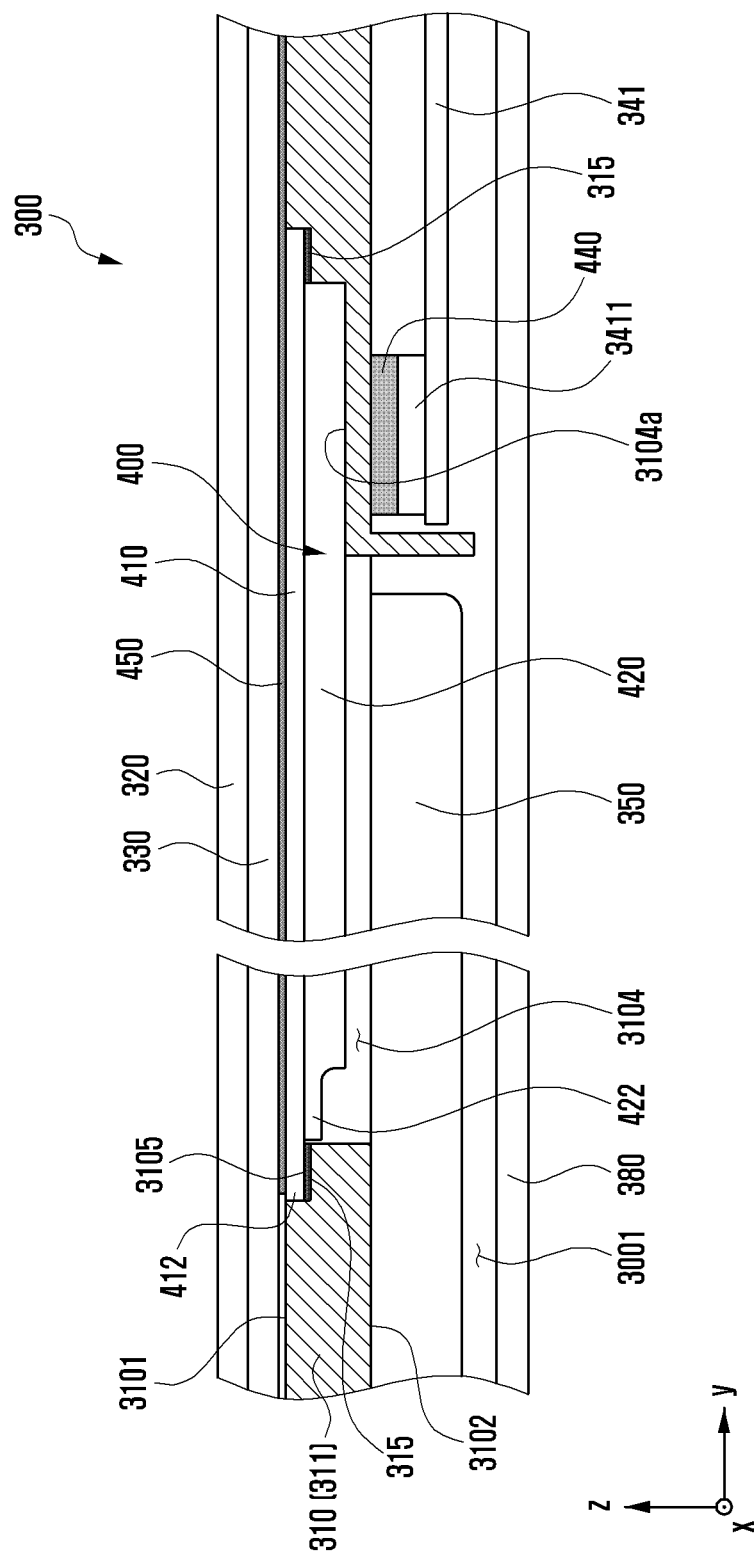

4B is a diagram illustrating a bottom view of a first plate according to various embodiments;

FIGS. 5A and 5B are diagrams illustrating top views of a vapor chamber according to various embodiments;

FIG. 6 is a cross-sectional view of a vapor chamber taken along line 6-6 of FIG. 5A according to various embodiments;

FIGS. 7A and 7B are diagrams illustrating a side member according to various embodiments;

FIGS. 8A, 8B and 8C are perspective views illustrating a state in which a vapor chamber is assembled to a side member according to various embodiments of;

FIG. 9 is a partial cross-sectional view of an electronic device including a vapor chamber according to various embodiments; and FIGS. 10A, 10B, 10C and 10D are cross-sectional views illustrating a vapor chamber according to various embodiments.

DETAILED DESCRIPTION

Figure 1:
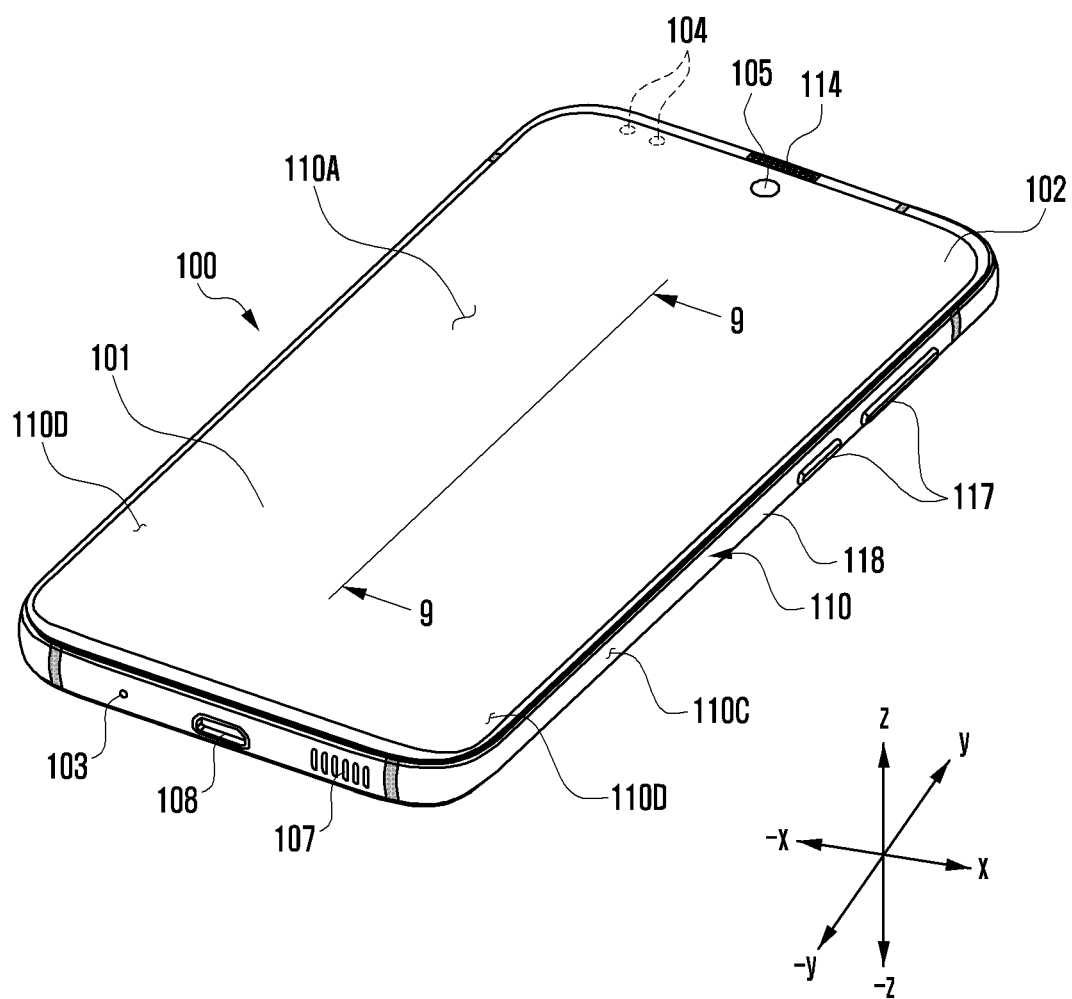
FIG. 1 is a front perspective view illustrating an electronic device (e.g., a mobile electronic device) according to various embodiments.
Figure 2:
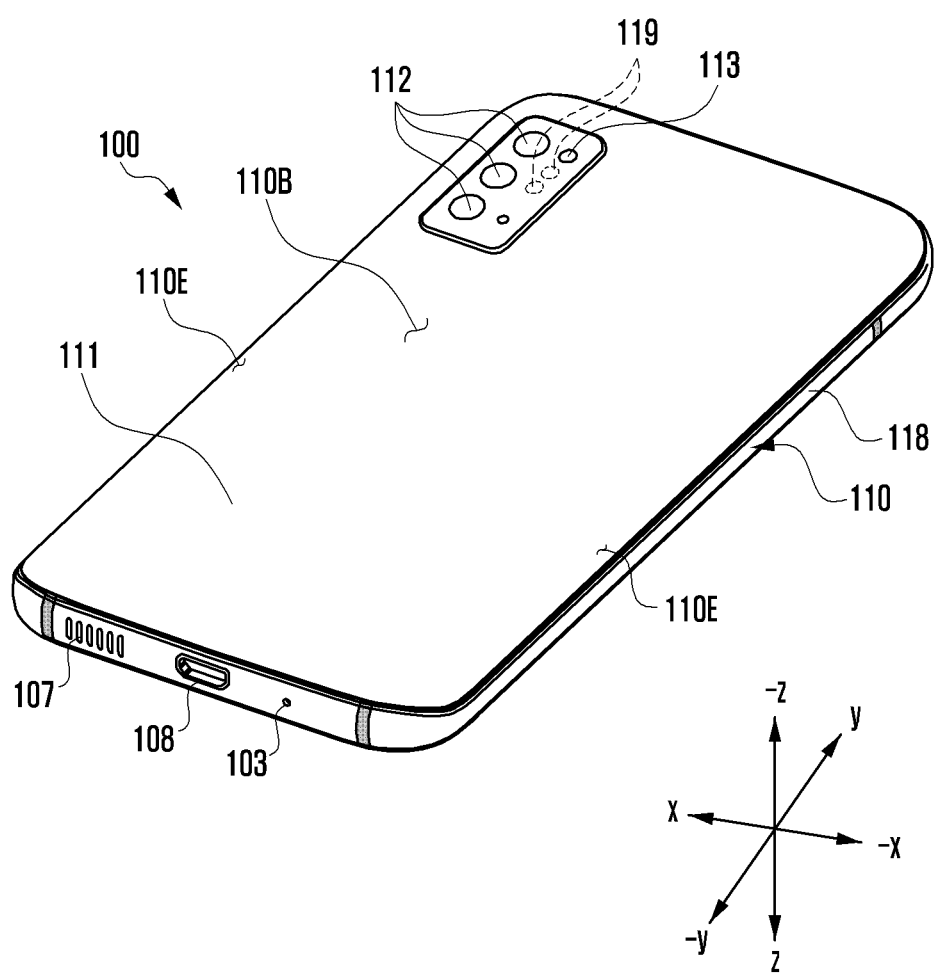
FIG. 2 is a rear perspective view illustrating the electronic device of FIG. 1 according to various embodiments.

FIG. 1 is a perspective view illustrating a front surface of a mobile electronic device according to various embodiments, and FIG. 2 is a rear a perspective view illustrating a rear surface of the mobile electronic device shown in FIG. 1 according to various embodiments.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector hole 108. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector hole 108 may include a first connector hole 108 adapted for a connector (e.g., a universal serial bus (USB) connector) for transmitting and receiving power and/or data to and from an external electronic device. The connector hole 108 may include a second connector hole (not shown) adapted for a connector (e.g., an earphone jack) for transmitting and receiving an audio signal to and from an external electronic device.

Some sensor modules 105 of camera modules 105 and 212, some sensor modules 104 of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. According to an embodiment, an area corresponding to some camera module 105 of the display 101 is a part of an area in which content is displayed, and may be formed as a transmission area having designated transmittance. For example, the transmission area may be formed to have transmittance having a range of about 5% to about 30%. For example, the transmission area may be formed to have transmittance having a range of about 30% to about 50%. For example, the transmission area may be formed to have transmittance having a range of over 50%. The transmission area may include an area overlapped with a valid area (e.g., a field of view (FOV)) of the camera module 105 through which light imaged by an image sensor and for generating an image passes. For example, a transmission area of the display 101 may include an area in which the density of pixels and/or a wiring density are lower than that of surroundings.

The camera module 305 may include, for example, under display camera (UDC). In an embodiment, some sensor modules 104 may be arranged to perform their functions without being visually exposed through the front plate 102 in the internal space of the electronic device. For example, in this case, an area of the display 101 facing the sensor module may not require a perforated opening.

According to various embodiments, an electronic device 100 has a bar-type or plate-type appearance, but the disclosure is not limited thereto. For example, the illustrated electronic device 100 may be a part of a foldable electronic device, a slidable electronic device, a stretchable electronic device, and/or a rollable electronic device. The "foldable electronic device", the "slidable electronic device", the "stretchable electronic device", and/or the "rollable electronic device" may be an electronic device at least a part of which is folded thanks to a bendable display (e.g., the display 330 in FIG. 3) may refer, for example, to an electronic device in which the display (e.g., the display 330 in FIG. 3) is bendable and thus at least partially folded, an electronic device in which at least a portion of the display is wound or rolled, an electronic device in which a region of the display is at least partially expandable, and/or an electronic device in which the display is capable of being received in the inside of a housing (e.g., the housing (e.g., the housing 110 in FIGS. 1 and 2). In the case of the foldable electronic device, the slidable electronic device, the stretchable electronic device, and/or the rollable electronic device, a user may use a screen display region in an expanded state by unfolding the display or exposing a greater area of the display to the outside if necessary.

Figure 3:
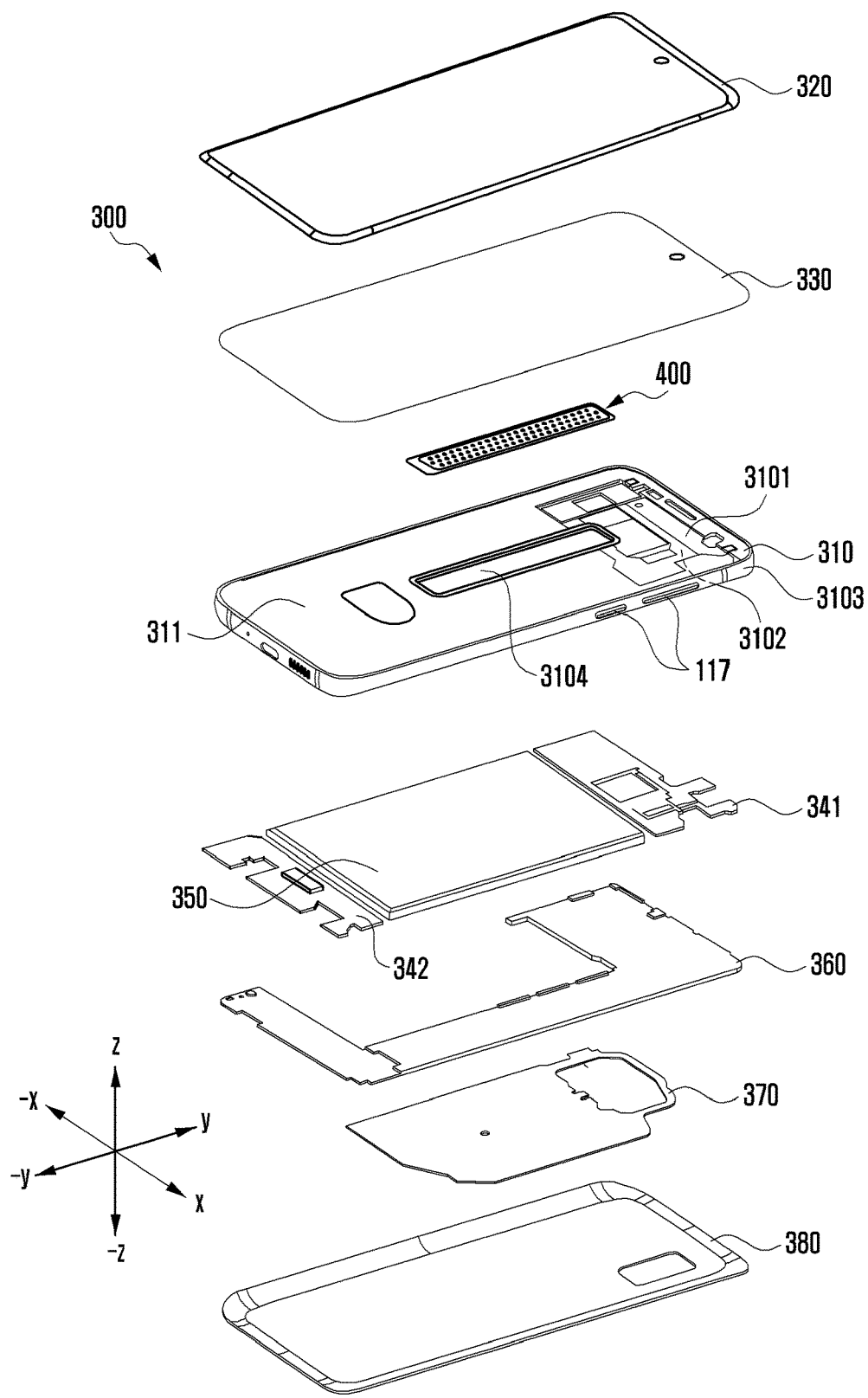
FIG. 3 is an exploded perspective view illustrating the electronic device of FIG. 1 according to various embodiments.

FIG. 3 is an exploded perspective view of the electronic device 100 of FIG. 1 according to various embodiments.

The electronic device 300 of FIG. 3 may include an example embodiment of an electronic device that is at least partially similar to or different from the electronic device 100 of FIGS. 1 and 2.

Referring to FIG. 3, the electronic device 300 (e.g., the electronic device 100 in FIG. 1 or FIG. 2) may include a side member 310 (e.g., a side bezel structure), a support member (e.g. a support) 311 (e.g., a bracket or a support structure), a front cover 320 (e.g., the front plate 102 in FIG. 1), a display 330 (e.g., the display 101 in FIG. 1), at least one board 341 and/or 342 (e.g., a printed circuit board (PCB), a flexible PCB (FPCB), or a rigid-flex PCB (R-FPCB)), a battery 350, an additional support member 360 (e.g., a rear case), an antenna 370, and a rear cover 380 (e.g., the rear plate 111 in FIG. 2). In various embodiments, in the electronic device 300, at least one of the components (e.g., the second support member 311 or the additional support member 360) may be omitted, or other components may be additionally included. At least one of the components of the electronic device 300 may be the same as or similar to at least one of the components of the electronic device 100 of FIG. 1 or 2, and a redundant description may be omitted below.

According to various embodiments, the side member 310 may include a first surface 3101 facing a first direction (e.g., z-axis direction), a second surface 3102 facing a direction opposite to the first surface 3101, and a side surface 3103 surrounding a space (e.g., the internal space 3001 in FIG. 9) between the first surface 3101 and the second surface 3102. According to an embodiment, at least a portion of the side surface 3103 may define an exterior of the electronic device. According to an embodiment, the support member 311 may be disposed in a manner of extending from the side member 310 toward the internal space (e.g., the internal space 3001 of FIG. 9) of the electronic device 300. In various embodiments, the support member 311 may be disposed separately from the side member 310. According to an embodiment, the side member 310 and/or the support member 311 may be made of, for example, a metal material and/or a non-metal material (e.g., a polymer). According to an embodiment, the support member 311 may support at least a portion of the display 330 via the first surface 3101, and may be disposed to support at least one board 341 or 342 and/or at least a portion of a battery 350 via the second surface 3102. According to an embodiment, the at least one board 341 or 342 may include a first board 341 (e.g., a main board) disposed at one side in the internal space (e.g., the internal space 3001 in FIG. 9) of the electronic device 300 with respect to the battery 350 and a second board 342 (e.g., a sub-board) disposed on at the other side. According to an embodiment, the first board 341 and/or the second board 342 may include a processor, a memory, and/or an interface.

According to an embodiment, the processor may include one or more of, for example, a central processing unit, an application processor, a graphics processor, an image signal processor, a sensor hub processor, or a communication processor. According to an embodiment, the memory may include, for example, a volatile memory or a nonvolatile memory. According to an embodiment, the interface may include, for example, a high-definition multimedia interface (HDMI), a universal serial bus (USB) interface, an SD card interface, and/or an audio interface. The interface may electrically or physically connect, for example, the electronic device 300 to an external electronic device and may include a USB connector, an SD card/an MMC connector, or an audio connector. According to an embodiment, the battery 350 is a device for supplying power to at least one component of the electronic device 300, and may include, for example, a non-rechargeable primary battery, a rechargeable secondary battery, or a fuel cell. At least a portion of the battery 350 may be disposed on, for example, a plane substantially coplanar with the at least one board 341 or 342. According to an embodiment, the battery 350 may be disposed in a manner of being embedded in the electronic device 300. In various embodiments, the battery 350 may be disposed to be detachable from/attachable to the electronic device 300.

According to various embodiments, the antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 is capable of, for example, performing short-range communication with an external device or transmitting/receiving power required for charging to/from an external device in a wireless manner. In various embodiments, an antenna structure may be configured by a portion of the side member 310, a portion of the support member 311, or a combination thereof. In various embodiments, the electronic device 300 may further include a digitizer for detecting an external electronic pen.

According to various embodiments, the electronic device 300 may include a vapor chamber 400 disposed in the internal space thereof (e.g., the internal space 3001 in FIG. 9) to rapidly diffuse, to the surroundings of the support member 311, heat generated from an electrical element (e.g., the electrical element 3411 in FIG. 9) disposed on the board 341 and acting as a heat generation source. According to an embodiment, the vapor chamber 400 may be configured to have a closed space (e.g., the closed space 4203 in FIG. 6) through a bonding structure of two plates (e.g., the first plate 410 and the second plate 420 in FIG. 4A). According to an embodiment, the vapor chamber 400 may be disposed in a manner of at least partially penetrating the through hole 3104 provided in the support member 311 or being at least partially accommodated in the through hole 3104 (as used herein, the "through hole" may include, but is not limited to, a hole, a recess, a cut out, or the like). In this case, through an example arrangement structure of the disclosure in which at least a portion of the improved bonding structure of the two plates (e.g., the first plate 410 and the second plate 420 in FIG. 4A) is disposed on the first surface 3101 of the support member 311, the vapor chamber 400 can be helpful in sliming the electronic device 300. In an embodiment, since the two metal plates (e.g., the first plate 410 and the second plate 420 of FIG. 4A) of the vapor chamber 400 are provided through a mechanical process (e.g., a stamping process, a pressing process, or a beading process), the metal plates can have excellent mechanical strength, and can be helpful in reinforcing the rigidity of the electronic device 300.

Hereinafter, the vapor chamber 400 disposed in the electronic device 300 will be described in greater detail with reference to various drawings.

Figure 4A:
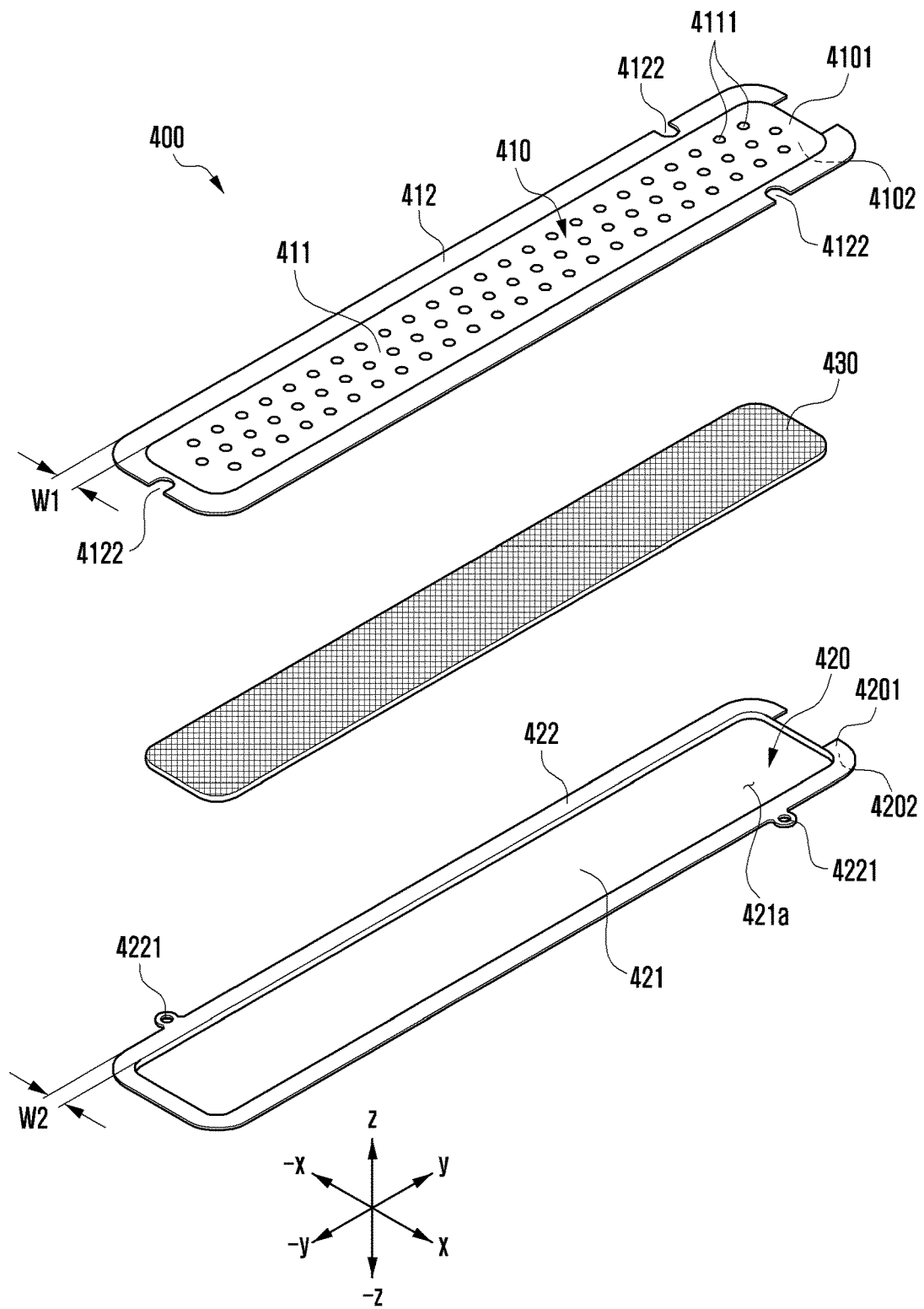
FIG. 4A is an exploded perspective view of a vapor chamber according to various embodiments.
Figure 4B:
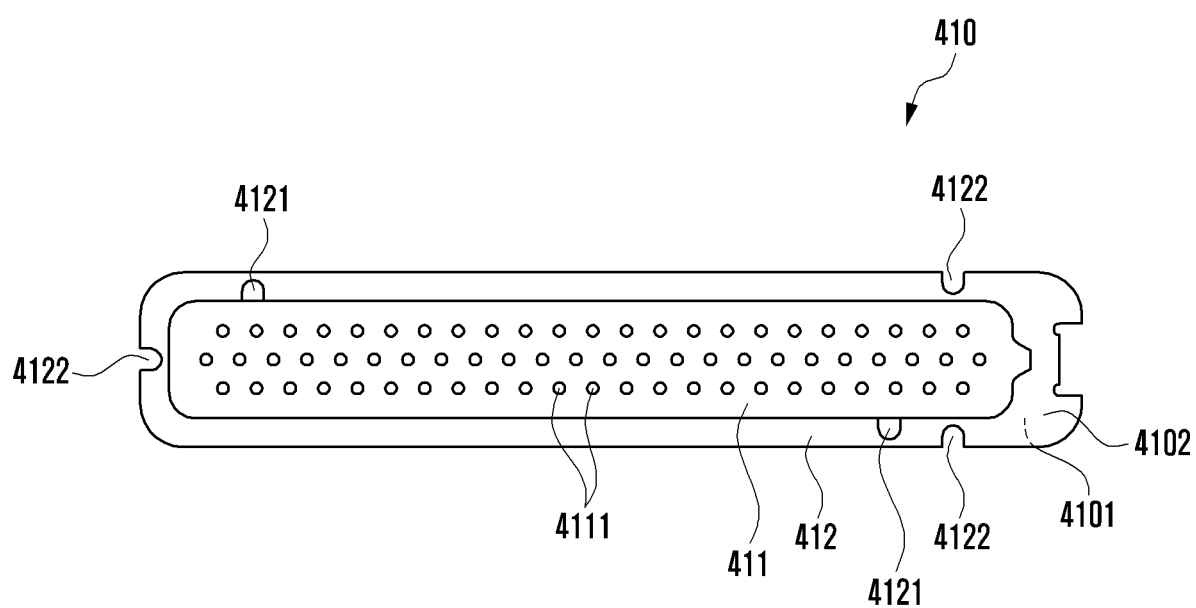

FIG. 4A is an exploded perspective view of a vapor chamber 400 according to various embodiments. FIG. 4B is a diagram illustrating a bottom view of a first plate 410 according to various embodiments.

Referring to FIGS. 4A and 4B, the vapor chamber 400 may include a first plate 410, a second plate 420 coupled to the first plate 410 in a manner of being at least partially bonded to the first plate 410, and a wick structure (e.g., wick) 430 disposed in a closed space (e.g., the closed space 4203 in FIG. 6) defined through the coupling of the 410 and the second plate 420. According to an embodiment, the wick structure 430 may, for example, include a copper screen mesh and may include water as a working fluid. In various embodiments, the wick structure 430 may be configured in a woven wired form. In various embodiments, the wick structure 430 may include a porous structure (e.g., a laminate of metal powder) chemically provided in the closed space (e.g., the closed space 4203 of FIG. 6). According to an embodiment, the first plate 410 and the second plate 420 may be made of a metal material that can be easily processed through a mechanical process (e.g., a stamping process, a pressing process, or a beading process). For example, the first plate 410 and the second plate 420 may, for example, and without limitation, be made of at least one of a copper alloy, a low-carbon stainless steel (e.g., 304L or 316L), or a titanium alloy. According to an embodiment, in the case of manufacturing the first plate 410 and/or the second plate 420 through a mechanical process (e.g., a stamping process, a pressing process, or a beading process), when the plates are made of a copper alloy material, a plate material having a thickness of about 50 μm or more may be used, and when the plates are made of a stainless steel or titanium alloy material, a plate material having a thickness of about 30 μm or more may be used.

According to various embodiments, the first plate 410 may include a first plate portion 411 and a first flange portion 412 extending at least partially along an edge of the first plate portion 411 to have a predetermined first width W1. According to an embodiment, the second plate 420 may include a second plate portion 421 having a size substantially corresponding to the first plate portion 411 and a second flange portion 422 at least partially extending along an edge of the second plate portion 421 to have a second width W2 smaller (e.g., less than) than the first width W1. According to an embodiment, the second plate 420 may include a recess 421a provided through the second plate portion 421 and the second flange portion 422 and having a predetermined depth. According to an embodiment, the recess 421a may be configured to a depth that is capable of accommodating the wick structure 430.

According to various embodiments, the first plate 410 may include a first plate surface 4101 facing a first direction (e.g., the z-axis direction) and a second plate surface 4102 facing a second direction (e.g., the −z-axis direction) opposite to the first direction. According to an embodiment, the second plate 420 may include a third plate surface 4201 facing the first direction (e.g., the z-axis direction) and corresponding to the second plate surface 4102 and a fourth plate surface 4202 facing the second direction (e.g., the −z axis direction) opposite to the third plate 4201. According to an embodiment, when the first plate 410 and the second plate 420 are bonded to each other, a closed space (e.g., the closed space 4203 in FIG. 6) may be defined by the second surface 4102 and the third surface 4201. For example, the second plate 420 may be bonded in a manner in which the second flange portion 422 is in plane contact with a portion of the first flange portion 412 of the first plate 410. According to an embodiment, the first plate 410 and the second plate 420 may be bonded through a process such as brazing, diffusion bonding, soldering, or ultrasonic welding such that the closed space (e.g., the closed space 4203 in FIG. 6) including the recess 421a substantially maintains a vacuum state.

According to various embodiments, the first plate 410 may include a plurality of pillars 4111 provided on the first plate part 411 to have a predetermined interval and/or protrusion amount. According to an embodiment, the plurality of pillars 4111 may be provided on the first plate 410 made of a metal material through a mechanical process (e.g., a stamping process, a pressing process, or a beading process). According to an embodiment, the plurality of pillars 4111 may be provided to protrude from the second plate surface 4102 of the first plate 410 toward the closed space (e.g., the −z-axis direction). According to an embodiment, the plurality of pillars 4111 may be provided to have a staggered type arrangement structure to reduce the flowing resistance of the working fluid. In various embodiments, the plurality of pillars 4111 may be provided to have an inline type arrangement structure. According to an embodiment, the plurality of pillars 4111 may have a protrusion amount that is capable of at least partially coming into contact with the wick structure 430 when the first plate 410 and the second plate 420 are bonded to each other.

According to various embodiments, the vapor chamber 400 may have an alignment structure capable of maintaining a temporarily assembled state before the first plate 410 and the second plate 420 are bonded to each other. For example, the vapor chamber 400 may include one or more seating grooves 4121 provided at the first flange portion 412 in the second surface 4102 of the first plate 410 to be lower than the outer surface. According to an embodiment, the vapor chamber 400 may include seating protrusions 4221 extending from the second flange portion 422 of the second plate 420 and provided at positions corresponding to the seating grooves 4121. Therefore, when the first plate 410 and the second plate 420 are temporarily assembled before being bonded to each other, the seating protrusions 4221 of the second plate 420 are seated in the seating grooves 4121 in the first plate 410 so that assembly positions can be aligned.

According to various embodiments, the vapor chamber 400 may include one or more alignment grooves 4122 provided along the edge of the first flange portion 412 of the first plate 410 and configured to accommodate alignment protrusions (e.g., the alignment protrusions 520 in FIGS. 8B and 8C) provided on a jig (e.g., the jig 500 in FIG. 8A) to be described in greater detail below. Accordingly, when the vapor chamber 400 is assembled through the through hole (e.g., the through hole 3104 in FIG. 3) in the support member (e.g., the support member 311 in FIG. 3), the position of the vapor chamber 400 is aligned in a manner in which the alignment protrusions (e.g., the alignment protrusions 520 in FIGS. 8B and 8C) penetrate the alignment grooves 4122 or are seated in the alignment grooves 4122.

FIG. 5A is diagram illustrating a top view of a vapor chamber according to various embodiments. FIG. 5B is a diagram illustrating a bottom view of the vapor chamber according to various embodiments.

Referring to FIGS. 5A and 5B, in the vapor chamber 400, when the first plate 410 and the second plate 420 are bonded to each other, the seating protrusions 4221 of the second plate 420 are seated in the seating grooves 4121 in the first plate 410 so that the temporary assembly state can be maintained and correct bonding can be aided. According to an embodiment, in the vapor chamber 400, a portion of the first flange portion 412 of the first plate 410 may be in plane contact with the second flange portion 422 of the second plate 420 and may be plane-bonded through a process such as brazing or welding. According to an embodiment, when the first plate 410 is viewed from above, at least a portion of the first flange portion 412 may not overlap the second flange portion 422 of the second plate 420.

FIG. 6 is a cross-sectional view of the vapor chamber taken along line 6-6 of FIG. 5A according to various embodiments.

Referring to FIG. 6, the vapor chamber 400 may include a first plate 410 including a plurality of pillars 4111 and a second plate 420 coupled to the first plate 410. According to an embodiment, when the first flange portion 412 of the first plate 410 and the second flange portion 422 of the second plate 420 are bonded to each other, the vapor chamber 400 may include a closed space 4203 defined by the first plate portion 411 of the first plate 410 and the second plate portion 421 including the recess 421a in the second plate 420. According to an embodiment, the vapor chamber 400 may include a wick structure 430 disposed in the closed space 4203 and including a working fluid (e.g., water). According to an embodiment, the first flange portion 412 having a first width W1 may at least partially overlap the second flange portion 422 having a second width W2 smaller (e.g., less) than the first width W1 when the first plate 410 is viewed from above, and may include a first portion 412a which is a bonded region and a second portion 412b extending from the first portion 412a and does not overlap the second flange portion 422. According to an embodiment, in the vapor chamber 400, the bonded portion in which the first portion 412a of the first flange portion 412 and the second flange portion 422 are bonded to each other and which has a first thickness t1 is accommodated in the hole 3104, and only the second portion 412b of the first flange portion 412 having a second thickness t2 smaller (e.g., less) than the first thickness t1 may be seated on the stepped surface 3105 provided along the edge of the through hole 3104 of the support member 311 to be lower than the first surface 3101. Through this arrangement structure, since the second plate 420 and the second flange portion 422 of the vapor chamber 400 are accommodated in the through hole 3104, and only the second portion 412b of the first flange portion 412 is arranged on the stepped surface 3105, the overall thickness of the electronic device can be reduced. In this case, since the first flange portion 412 and the first surface 3101 of the support member 311 are arranged to have a substantially flat surface, smooth arrangement of electronic components (e.g., a display) disposed thereon can be guided.

According to various embodiments, the plurality of pillars 4111 may be provided to have a predetermined protrusion amount from the first plate portion 411 to the closed space 4203 and/or a predetermined interval T. According to an embodiment, the plurality of pillars 4111 may be provided to have a protrusion amount to be at least partially in contact with the wick structure 430. According to an embodiment, the plurality of pillars 4111 may be provided as circular protrusions having a diameter D of about 1 mm or less. However, the disclosure is not limited thereto, and the plurality of pillars 4111 may be provided in various shapes such as a quadrangle or a polygon. According to an embodiment, the plurality of pillars 4111 may be arranged to have an interval in the range of about 2.5 mm to about 3.5 mm. According to an embodiment, the plurality of pillars 4111 may be provided through a mechanical process (a stamping process, a pressing process, or a beading process) of the first plate portion 411 made of a metal material. According to an embodiment, the outer surface of the first plate portion 411 may include grooves 4111*a* provided to be lower than the outer surface to correspond to the shape of the plurality of pillars 4111. These grooves 4111*a* may provide an expanded heat dissipation area. In various embodiments, the plurality of pillars 4111 may be provided through a chemical process (e.g., an etching process) of the first plate portion 411 made of a metal material.

FIG. 7A is a diagram illustrating a front view of a side member according to various embodiments, and FIG. 7B is a diagram illustrating a rear view of the side member according to various embodiments.

Referring to FIGS. 7A and 7B, an electronic device (e.g., the electronic device 300 in FIG. 3) may include a side member 310 and a support member 311 extending to the internal space (e.g., the internal space 3001 in FIG. 9) of the electronic device (e.g., the electronic device 300 in FIG. 3) from the side member 3100. According to an embodiment, the side member 311 may include a conductive portion 310*a* (e.g., a metal material) and a non-conductive portion 310*b* (e.g., a polymer) coupled to the conductive portion 310*a*. According to an embodiment, the conductive portion 310*a* may be arranged to have excellent rigidity based on an efficient arrangement design of electronic components disposed in the internal space (e.g., the internal space 3001 in FIG. 9) of the electronic device (e.g., the electronic device 300 of FIG. 3).

According to various embodiments, the side member 310 may include a first surface 3101 facing a predetermined direction (e.g., the z-axis direction), a second surface 3102 facing a direction (e.g., the −z-axis direction) opposite to the first surface 3101, and a side surface 3103 surrounding the space between the first side 3101 and the second side 3102. According to an embodiment, the side surface 3103 may include a first side surface 3103*a* having a first length in a predetermined direction (e.g., the y-axis direction), a second side surface 3103*b* extending from the first side surface 3103*a* to a direction (e.g., the −x-axis direction) perpendicular to the first side surface 3103*a*, a third side surface 3103*c* extending from the second side surface 3103*b* substantially parallel to the first side surface 3103*a*, and a fourth side surface 3103*d* extending from the third side surface 3103*c* substantially parallel to the second side surface 3103*b*, connected to the first side surface 3103*a*, and having a second length. Accordingly, the electronic device (e.g., the electronic device 300 of FIG. 3) may have a length in a direction (e.g., the y-axis direction) parallel to the first side surface 3103*a* and the third side surface 3103*c* of the side member 310.

According to various embodiments, the side member 310 may include a through hole (e.g., a through hole may include, for example, and without limitation, a recess, a hole, a cut out or the like) 3104 provided in at least a portion thereof from the first surface 3101 to the second surface. According to an embodiment, the through hole 3104 may have a size substantially corresponding to the size of the second plate portion (e.g., the second plate portion 421 in FIG. 6) of the vapor chamber (e.g., the vapor chamber 400 in FIG. 6). According to an embodiment, the through hole 3104 may include a stepped surface 3105 provided along the edge thereof to be lower than the first surface 3101 to accommodate the second portion (e.g., the second portion 412*b* in FIG. 6) of the first flange portion (e.g., the first flange portion 412 of FIG. 6) of the first plate (e.g., the first plate 410 of FIG. 6). According to an embodiment, the through hole 3104 may have an at least partially closed end 3104*a*. For example, the closed end 3104*a* may not be penetrated from the first surface 3101 to the second surface 3102. For example, the closed end 3104*a* may be provided in the first surface 3101 through counter-boring to be lower than the first surface 3101. Accordingly, the closed end 3104*a* may accommodate the vapor chamber (e.g., the vapor chamber 400 in FIG. 6) to be in contact with at least a portion of the second plate portion (e.g., the second plate portion 421 in FIG. 6). According to an embodiment, the closed end 3104*a* may be arranged at a position at which the closed end 3104*a* at least partially overlaps an electrical element (e.g., the electrical element 3411 in FIG. 9), which is a heat generation source disposed in the surface between the second surface 3102 and the rear cover (e.g., the rear cover 380 in FIG. 9), when the first surface 3101 is viewed from above, whereby the closed end 3104 may be helpful in preventing and/or reducing the vapor chamber 400 from being pushed out of the through hole 3104 by the heat dissipation member (e.g., the heat dissipation member 440 of FIG. 9).

FIG. 8A is a perspective view illustrating a state in which a vapor chamber is assembled to a side member according to various embodiments, FIG. 8B is a perspective view illustrating a state in which the vapor chamber is assembled to a side member according to various embodiments, and FIG. 8C is a perspective view illustrating a state in which the vapor chamber is assembled to a side member according to various embodiments.

Referring to FIGS. 8A, 8B and 8C, the position of the side member 310 may be fixed to a separate jig 500 before the vapor chamber 400 is fixed. According to an embodiment, the position of the side member 310 may be aligned through a plurality of jig protrusions 510 disposed on the jig 500. In this case, the jig 500 may include at least one alignment protrusion 520 disposed to protrude through a through hole (e.g., 3104 in FIGS. 7A and 7B) provided in the support member 311. According to an embodiment, when the vapor chamber 400 is placed on the side member 310 aligned with the jig 500, at least one alignment groove 4122 provided in the first plate 410 of the vapor chamber 400 penetrates at least one alignment groove 4122 provided in the first plate 410 of the vapor chamber 400 so that the vapor chamber 400 can be aligned with the through hole (e.g., the through hole 3104 in FIGS. 7A and 7B). According to an embodiment, the vapor chamber 400 may be attached to the side member 310 using a tape member (e.g., the tape member 315 in FIG. 9) or through a bonding process.

FIG. 9 is a partial cross-sectional view of an electronic device including a vapor chamber according to various embodiments.

FIG. 9 is, for example, a partial cross-sectional view of the electronic device taken along line 9-9 in FIG. 1.

Referring to FIG. 9, the electronic device 300 may include a first side member 310 including a support member 311 including a first surface 3101 facing a first direction (e.g., the z-axis direction) and a second surface 3102 facing a second direction (e.g., the −z-axis direction) opposite to the first surface 3101, a front cover 320 disposed to correspond to the first surface 3101, a display 330 disposed between the front cover 320 and the first surface 3101 and visible from the outside through the front cover 320, a rear cover 380 disposed to correspond to the second surface 3102, a board 341 (e.g., the first board 341 in FIG. 3) disposed between the rear cover 380 and the second surface 3102, and a battery disposed near the board 341. According to an embodiment, the support member 311 may include a through hole 3104. According to an embodiment, the through hole 3104 may include a vapor chamber 400 disposed from the first surface 3101 to the second surface 3102. According to an embodiment, the vapor chamber 400 may be configured with the first plate 410 and the second plate 420 coupled to the first plate 410, wherein a portion of the first flange portion 412 of the first plate 410 may be disposed in a manner of being seated on a stepped surface provided along the edge of the through hole 3104 to be lower than the first surface 3101. According to an embodiment, the vapor chamber 400 may be fixed to the stepped surface 3105 of the support member 311 via a tape member 315. For example, the tape member 315 may have a thickness of about 50 µm. In this case, the vapor chamber 400 may be coupled to provide a substantially flat surface with the first surface 3101, thereby being helpful in arranging the display 330 smoothly. According to an embodiment, at least a portion of the vapor chamber 400, extending from the through hole 3104 and may be accommodated through the closed end 3104a provided through counter-boring to be lower than the first surface 3101.

According to various embodiments, the electronic device 300 may include a board 341 disposed in a space between the support member 311 and the rear cover 380 to at least partially overlap the vapor chamber 400 when the first surface 3101 is viewed from above, an electrical element 3411 disposed on the board 341, and a heat dissipation member 440 disposed in a space between the electrical element 3411 and the support member 311. According to an embodiment, the heat dissipation member 440 may be in contact with the electrical element 3411 and may be thermally connected to the support member 311. For example, the heat dissipation member 440 may be disposed to be close to or in physical contact with the support member 311. According to an embodiment, the heat dissipation member 440 may include a thermal interface material (TIM) or graphite sheet. According to an embodiment, the electronic device 300 may include a heat dissipation sheet 450 disposed between the first surface 3101 and the display 330. According to an embodiment, the heat dissipation sheet 450 may be disposed to at least partially overlap the vapor chamber 400 when the first surface 3101 is viewed from above. According to an embodiment, the heat dissipation sheet 450 may include a graphite sheet.

According to various example embodiments of the disclosure, heat generated from the electrical element 3411 may be collected by the heat dissipation member 440 and may be transferred to the support member 311. According to an embodiment, the heat transferred to the support member 311 may be rapidly diffused to the entire region of the support member 311 via the vapor chamber 400 and the heat dissipation sheet 450 overlapping the same. Moreover, since the vapor chamber 400 is disposed along the longitudinal direction (e.g., the y-axis direction) in substantially the center of the support member 311, and a relatively thick support member is provided through the improved arrangement structure of the vapor chamber 400 (e.g., the seating structure of the stepped surface 3105 for the first flange portion 412), rigidity can be reinforced and rapid heat diffusion can be assisted.

Referring to Table 1 below, when the same TIM is disposed between the electrical element 3411 and the support member 311 as the heat dissipation member 440 and the electrical element 3411 generates heat at 1.2 A, it can be seen that, during the same period of time, in the existing structure, the periphery of the front cover 320 corresponding to the electrical element 3411 has a temperature of about 44.5 degrees C., the periphery of the rear cover 380 corresponding to the electrical element 3411 has a temperature of 43.8 degrees C., and the temperature of the electrical element 3411 is about 66.5 degrees, whereas, in an improved structure in which the vapor chamber 400 according to the disclosure is arranged, the periphery of the front cover 320 corresponding to the electrical elements has a temperature of 42.3 degrees which exhibits an improvement of about 2.2 degrees C., the periphery of the rear cover 380 corresponding to the electrical element 3411 has a temperature of about 42.2 degrees which exhibits an improvement of about 1.6 degrees C. is achieved, and the temperature of the electrical element 3411 is about 64.0 degrees which exhibits an improvement of about 2.5 degrees C.

TABLE 1

| Heat dissipation member | | Existing structure TIM | Structure according to disclosure TIM |
|---|---|---|---|
| Heat generation (at 1.2 A) | Periphery of front cover | 44.5 degrees C. | 42.3 degrees C. |
| Heat generation (at 1.2 A) | Periphery of rear cover | 43.8 degrees C. | 42.2 degrees C. |
| | Temperature of electrical element (AP) | 66.5 degrees C. | 64.0 degrees C. |

Figure 10A:
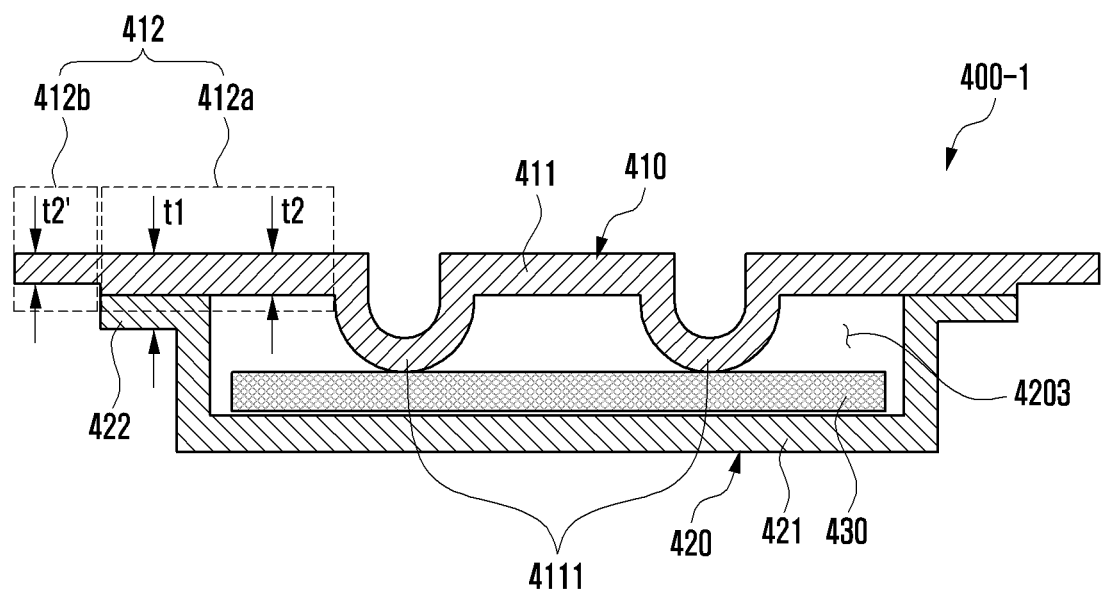
Figure 10B:
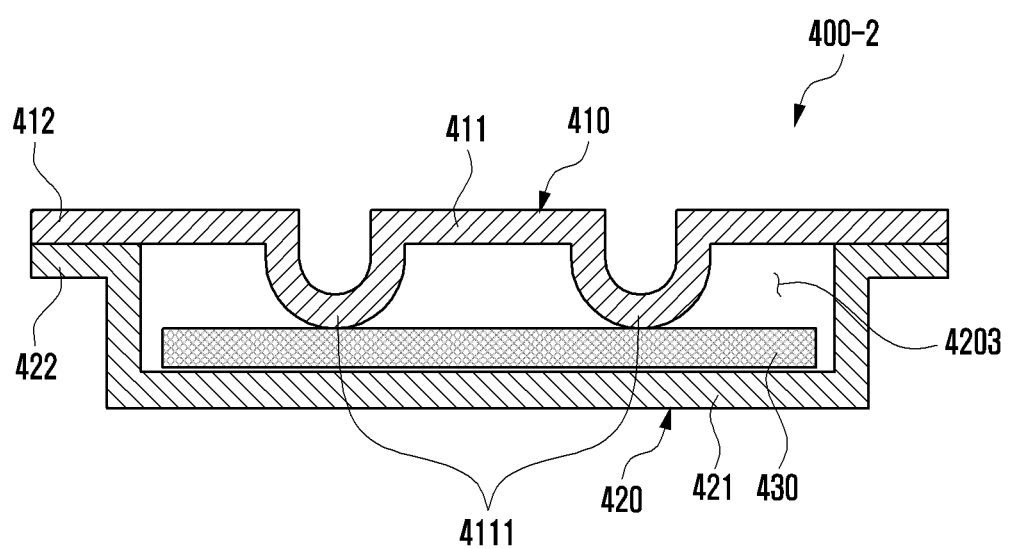
Figure 10C:
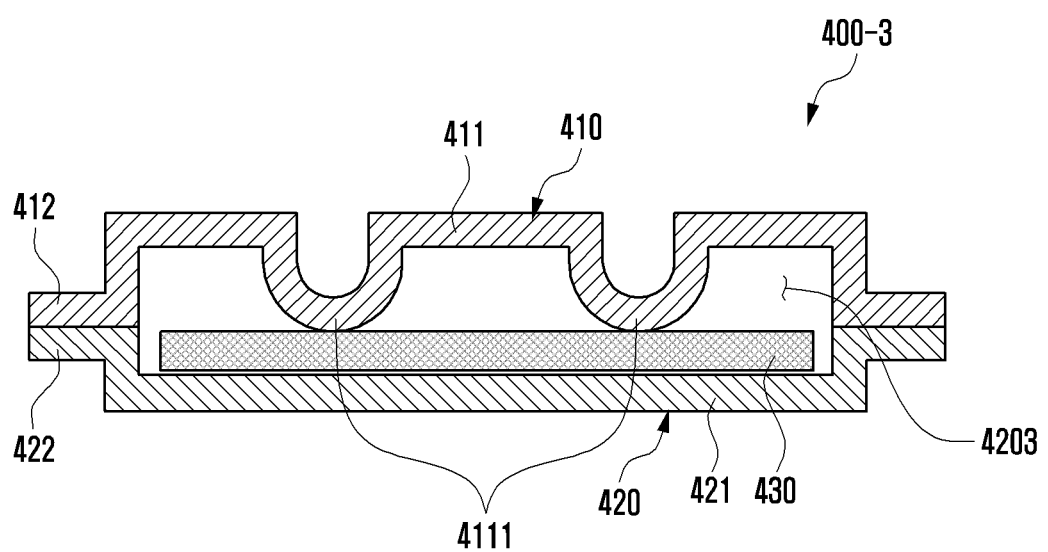
Figure 10D:
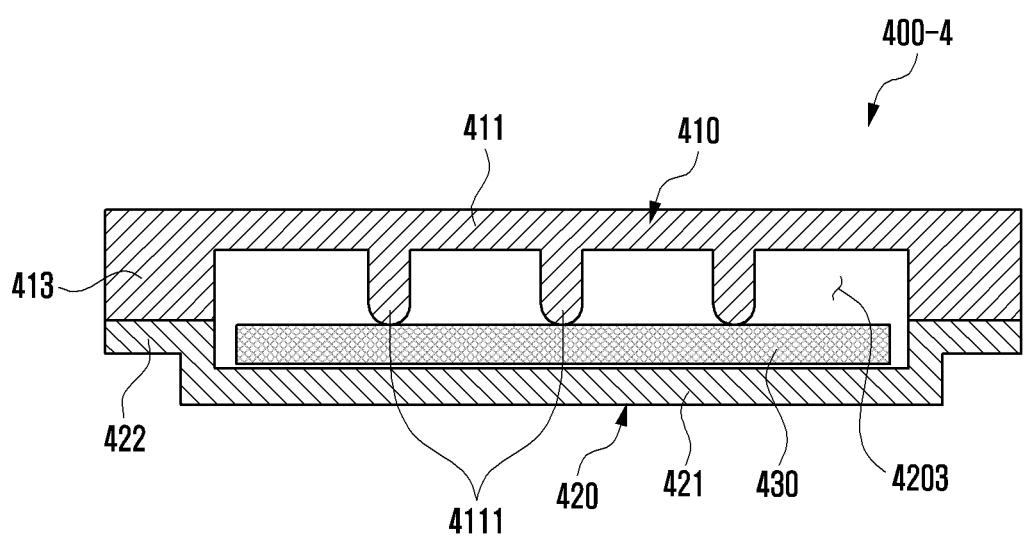

FIG. 10A is a cross-sectional view of a vapor chamber according to various embodiments, FIG. 10B is a cross-sectional view of a vapor chamber according to various embodiments, FIG. 10C is a cross-sectional view of a vapor chamber according to various embodiments, and FIG. 10D is a cross-sectional view of a vapor chamber according to various embodiments.

In describing the vapor chambers 400-1, 400-2, 400-3, and 400-4 of FIGS. 10A, 10B, 10C and 10D, respectively, the components substantially the same as those of the vapor chamber 400 of FIG. 6 will be denoted by the same reference numerals, and a detailed description thereof may not be repeated here.

Referring to FIG. 10A, the vapor chamber 400-1 may include a first plate 410, a second plate 420 coupled to the first plate 410, and a wick structure 430 disposed in a closed space 4203 defined by the first plate 410 and the second plate 420. According to an embodiment, the first plate 410 may include a first flange portion 412 including a first portion 412a bonded to the second flange portion 422 of the second plate 420 and a second portion 412b extending from the first portion 412a and seated on the seated surface (e.g., the seated surface 3105 in FIG. 9) of the support member (e.g., the support member 311 in FIG. 9). According to an embodiment, by passing through a press process, the second portion 412b has a third thickness t2' thinner than a second thickness t2 of the first portion 412a, and thus the stepped depth of the stepped surface (e.g., the stepped surface 3105 in FIG. 9) of the support member (e.g., the support member 311 in FIG. 9) is lowered, which can be helpful in reinforcing the rigidity of the support member (e.g., the support member 311 in FIG. 9).

Referring to FIG. 10B, in the vapor chamber 400-2, the first flange portion 412 of the first plate 410 and the second flange portion 422 of the second plate 420 having the same length may be formed and then bonded to each other.

Referring to FIG. 10C, in the vapor chamber 400-3, the first flange portion 412 of the first plate 410 may have a bent step. The first flange portion 412 of the first plate 410 having the same length as the second flange portion 422 of the second plate 420 may be provided and then bonded to the second flange portion 422 of the second plate 420.

According to various embodiments, the first plate 410 and the plurality of pillars 4111 integrated with the first plates 410 in FIGS. 10A, 10B and 10C may be provided through a mechanical process (e.g., a stamping process, a pressing process, or a beading process).

Referring to FIG. 10D, the vapor chamber 400-4 may include a bonding portion 413 provided along the edge of the first plate portion 411 of the first plate 410. According to an embodiment, the first plate 410 may include a plurality of pillars 4111 protruding into the internal space 4203 of the vapor chamber 400-4. According to an embodiment, the first plate 410 and the plurality of pillars 4111 may be provided through a chemical process (e.g., an etching process). According to an embodiment, the second plate may be provided through a mechanical process (e.g., a stamping process, a pressing process, or a beading process). According to an embodiment, the vapor chamber 400-4 may be configured by bonding the bonding portion 413 of the first plate 410 to the second flange portion 422 of the second plate 420.

According to various embodiments, the first plate 410 and the plurality of pillars 4111 may be provided using a plurality of processing methods (e.g., a mechanical process and/or a chemical process) in combination. For example, the first plate 410 and the plurality of pillars 4111 may be provided using different or the same processing methods.

According to various example embodiments, an electronic device (e.g., the electronic device 300 in FIG. 9) may include: a housing (e.g., the housing 110 in FIG. 1), a support member (e.g., the support member 311 in FIG. 9) disposed in an internal space (e.g., the internal space 3001 in FIG. 9) of the housing and including a first surface (e.g., the first surface 3101 in FIG. 9) facing a first direction (e.g., the z-axis direction in FIG. 9) and a second surface (e.g., the second surface 3102 in FIG. 9) facing a direction (e.g., the −z axis direction in FIG. 9) opposite the first surface, wherein the support includes a through hole (e.g., the through hole 3104 in FIG. 9, wherein the through hole may include, for example, and without limitation, a hole, a recess, a cut out, or the like) in at least a portion thereof, a vapor chamber (e.g., the vapor chamber 400 in FIG. 9) disposed through at least a portion of the through hole, wherein the vapor chamber may include a first plate (e.g., the first plate 410 in FIG. 6) including a first plate portion (e.g., the first plate portion 411 in FIG. 6) including a plurality of pillars (e.g., the plurality of pillars 4111 in FIG. 6) and a first flange portion (e.g., the first flange portion 412 in FIG. 6) extending along an edge of the first plate portion to have a first width (e.g., the width W1 in FIG. 6), a second plate (e.g., the second plate 420 in FIG. 6) having a size corresponding to the first plate portion and including a second plate portion (e.g., the second plate portion 421 in FIG. 6) including a recess (e.g., the recess 421a in FIG. 6) and a second flange portion (e.g., the second flange portion 422 in FIG. 6) extending along an edge of the second plate portion to have a second width (e.g., the second width W2 in FIG. 6) less than the first width, and at least one wick (e.g., the wick structure 430 in FIG. 6) disposed in the recess, wherein the wick may be accommodated in a closed space (e.g., the closed space 4203 in FIG. 6) defined through coupling of the first plate and the second plate, wherein the first plate and the second plate may be coupled to each other through joining of the first flange portion and the second flange portion, and wherein the vapor chamber may be disposed in a manner in which at least a portion of the first flange portion that does not overlap the second flange portion is disposed on the first surface when the first plate is viewed from above.

According to various example embodiments, the second plate may be accommodated in at least a portion of the through hole.

According to various example embodiments, the first surface may include a stepped surface provided along an edge of the through hole to be lower than the first surface, and a portion of the first flange portion may be seated on the stepped surface.

According to various example embodiments, the first plate and the first surface may define a substantially coplanar surface when the vapor chamber is disposed on the support member.

According to various example embodiments, the plurality of pillars may protrude from the first plate portion into the closed space to have a specified protrusion amount and a specified interval therebetween.

According to various example embodiments, the plurality of pillars may comprise circular protrusions having a diameter of 1 mm or less.

According to various example embodiments, the interval between the plurality of pillars may be in a range of about 2.5 mm to 3.5 mm.

According to various example embodiments, the plurality of pillars may be in contact with the wick.

According to various example embodiments, the plurality of pillars may be provided integrally with the first plate comprising a metal material through a stamping, beading, or pressing process, and the outer surface of the first plate portion may include grooves provided to be lower than the outer surface to correspond to a shape of the pillars.

According to various example embodiments, the wick may comprise a copper screen mesh.

According to various example embodiments, the first flange portion may include at least one seating groove provided in a portion thereof, and the first plate and the second plate may be aligned before the bonding in a manner in which at least one seating protrusion provided at a corresponding position of the second flange portion is seated in the at least one seating groove.

According to various example embodiments, the first plate and/or the second plate may comprise at least one of a copper alloy, a low-carbon stainless steel, or a titanium alloy.

According to various example embodiments, the sealing member may be made of a metal material.

According to various example embodiments, the housing may include: a front cover corresponding to the first surface, a rear cover corresponding to the second surface, and a conductive side surrounding the internal space between the front cover and the rear cover, wherein the support may extend from the conductive side into the internal space.

According to various example embodiments, the electronic device may further include at least one electrical element disposed in a space between the second surface and the rear cover to at least partially overlap the vapor chamber when the first surface is viewed from above.

According to various example embodiments, the vapor chamber may be disposed to overlap the electrical element with the support interposed therebetween when the first surface is viewed from above.

According to various example embodiments, the electronic device may further include a heat dissipation sheet disposed between the electrical element and the support.

According to various example embodiments, the heat dissipation sheet may include a thermal interface material (TIM) or a graphite sheet.

According to various example embodiments, the electronic device may include a battery disposed in a space between the second surface and the rear cover to at least partially overlap the vapor chamber when the first surface is viewed from above.

According to various example embodiments, the electronic device may further include a display disposed in a space between the first surface and the front cover to be visible from outside through the front cover, and a heat dissipation sheet disposed between the first surface and the display to at least partially overlap the vapor chamber when the first surface is viewed from above.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
a housing;
a support member disposed in an internal space of the housing and including a first surface and a second surface facing a direction opposite the first surface, wherein the support member includes a through hole in at least a portion thereof; and
a vapor chamber disposed through at least a portion of the through hole, wherein the vapor chamber includes:
a first plate including a first plate portion including a plurality of pillars and a first flange portion extending along an edge of the first plate portion to have a first width;
a second plate having a size corresponding to the first plate portion and including a second plate portion including a recess and a second flange portion extending along an edge of the second plate portion to have a second width less than the first width; and
at least one wick disposed in the recess,
wherein the wick is accommodated through a closed space defined through coupling of the first plate and the second plate, and
wherein the first plate and the second plate are coupled to each other through bonding of the first flange portion and the second flange portion, and
wherein the vapor chamber is disposed in a manner in which at least a portion of the first flange portion that does not overlap the second flange portion is disposed on the first surface when the first plate is viewed from above,
wherein the first flange portion includes at least one seating groove provided in a portion thereof and the second flange portion includes at least one seating protrusion extending from a side of the second flange portion and provided at a corresponding position of the at least one seating groove for aligning the first flange portion to the second flange portion.

2. The electronic device of claim 1, wherein the second plate is accommodated in at least a portion of the through hole.

3. The electronic device of claim 1, wherein the first surface includes a stepped surface provided along an edge of the through hole to be lower than the first surface, and
a portion of the first flange portion is seated on the stepped surface.

4. The electronic device of claim 3, wherein the first plate and the first surface define a substantially coplanar surface when the vapor chamber is disposed on the support member.

5. The electronic device of claim 1, wherein the plurality of pillars protrude from the first plate portion into the closed space to have a specified protrusion amount and a specified interval therebetween.

6. The electronic device of claim 5, wherein the plurality of pillars comprise circular protrusions having a diameter of 1 mm or less.

7. The electronic device of claim 5, wherein the interval between the plurality of pillars is in a range of 2.5 mm to 3.5 mm.

8. The electronic device of claim 5, wherein the plurality of pillars contact the wick.

9. The electronic device of claim 5, wherein the plurality of pillars are provided integrally with the first plate comprising a metal material through a stamping, beading, or pressing process, and
an outer surface of the first plate portion includes grooves provided to be lower than the outer surface corresponding to a shape of the pillars.

10. The electronic device of claim 1, wherein the wick comprises a copper screen mesh.

11. The electronic device of claim 1, wherein
the first plate and the second plate are aligned before the bonding of the second flange portion to the first flange portion using the at least one seating groove and the at least one seating protrusion.

12. The electronic device of claim 1, wherein the first plate and/or the second plate comprises at least one of a copper alloy, a low-carbon stainless steel, or a titanium alloy.

13. The electronic device of claim 1, wherein the support member comprises a metal material.

14. The electronic device of claim 1, wherein the housing includes:
a front cover corresponding to the first surface;
a rear cover corresponding to the second surface; and
a conductive side member surrounding the internal space between the front cover and the rear cover, and
wherein the support member extends from the conductive side member into the internal space.

15. The electronic device of claim 14, further comprising:
at least one electrical element disposed in a space between the second surface and the rear cover at least partially overlapping the vapor chamber when the first surface is viewed from above.

16. The electronic device of claim 15, wherein the vapor chamber is disposed to overlap the electrical element with the support member interposed therebetween when the first surface is viewed from above.

17. The electronic device of claim 16, further comprising:
- a heat dissipation member sheet disposed between the electrical element and the support member.

18. The electronic device of claim 17, wherein the heat dissipation member sheet includes a thermal interface material (TIM) or a graphite sheet.

19. The electronic device of claim 14, further comprising:
- a battery disposed in a space between the second surface and the rear cover at least partially overlapping the vapor chamber when the first surface is viewed from above.

20. The electronic device of claim 14, further comprising:
- a display disposed in a space between the first surface and the front cover and visible from outside through the front cover, and
- a heat dissipation sheet disposed between the first surface and the display at least partially overlapping the vapor chamber when the first surface is viewed from above.

* * * * *